United States Patent
Dwyer

(10) Patent No.: US 7,620,377 B2
(45) Date of Patent: Nov. 17, 2009

(54) BANDWIDTH ENHANCEMENT FOR ENVELOPE ELIMINATION AND RESTORATION TRANSMISSION SYSTEMS

(75) Inventor: Richard James Dwyer, Chandler, AZ (US)

(73) Assignee: General Dynamics C4 Systems, Scottsdale, AZ (US)

( * ) Notice: Subject to any disclaimer, the term of this patent is extended or adjusted under 35 U.S.C. 154(b) by 491 days.

(21) Appl. No.: 11/512,256

(22) Filed: Aug. 30, 2006

(65) Prior Publication Data

US 2008/0057881 A1    Mar. 6, 2008

(51) Int. Cl.
*H04B 1/02* (2006.01)
(52) U.S. Cl. .................... 455/108; 455/127.1; 375/295
(58) Field of Classification Search .................. 455/91, 455/108, 110, 114.1, 115.1, 127.1–127.4; 375/295, 296
See application file for complete search history.

(56) References Cited

U.S. PATENT DOCUMENTS

| | | | |
|---|---|---|---|
| 6,141,541 A | 10/2000 | Midya et al. | |
| 6,151,571 A | 11/2000 | Pertrushin | |
| 6,275,806 B1 | 8/2001 | Pertrushin | |
| 6,377,116 B1 | 4/2002 | Mattsson et al. | |
| 6,538,509 B2 | 3/2003 | Ren | |
| 6,600,369 B2 | 7/2003 | Mitzlaff | |
| 6,696,866 B2 | 2/2004 | Mitzlaff | |
| 6,725,021 B1 | 4/2004 | Anderson et al. | |
| 6,735,419 B2 | 5/2004 | Mitzlaff | |
| 6,801,082 B2 | 10/2004 | Midya et al. | |
| 6,826,960 B2 | 12/2004 | Schaad et al. | |
| 6,868,931 B2 | 3/2005 | Morrell et al. | |
| 7,421,037 B2 * | 9/2008 | Shakeshaft et al. | 375/295 |
| 7,424,064 B2 * | 9/2008 | Shakeshaft et al. | 375/295 |
| 2006/0240789 A1 * | 10/2006 | Rosnell et al. | 455/127.4 |

* cited by examiner

*Primary Examiner*—Thanh C Le
(74) *Attorney, Agent, or Firm*—Hunton & Williams LLP

(57) ABSTRACT

Systems and methods for increasing bandwidth capability of an envelope elimination and restoration (EER) transmitter. A frequency response of a power supply modulator of the transmitter is approximated. An inverse response is applied to the envelope signal prior to digital-to-analog conversion (DAC) and before the signal reaches the power supply modulator to pre-emphasize the signal thereby counteracting distorting affects of the modulator. The filter is implemented using any of a variety of different digital techniques including programmable logic, DSP, etc.

21 Claims, 12 Drawing Sheets

PRIOR ART

PRIOR ART $$H_p(z) = \frac{1}{H(z)}$$

BANDWIDTH ENHANCEMENT FOR ENVELOPE ELIMINATION AND RESTORATION TRANSMISSION SYSTEMS

FIELD OF THE INVENTION

The present invention relates to radio frequency (RF) communication systems and more particularly to systems and methods for bandwidth enhancement in envelope elimination and restoration transmission systems.

BACKGROUND OF THE INVENTION

Wireless transmission systems are well known in the art. As wireless networks have become more pervasive and product manufacturing costs have made the demand for wireless phones and two-way radios steadily increase.

When transmitting a signal, these devices take an input signal, modulate it using one or more known modulation schemes, and amplify the signal for transmission. The power amplifier takes the modulated signal as its input and amplifies it using a constant or variable amplification technique. Ideally, this process yields an amplified copy of the amplifier's input signal across the signal's spectrum. In practice this type of linear amplification is difficult to obtain.

The output power of a power amplifier is generally a direct function of its supply power, that is, a higher supply power will yield greater amplification. However, the level of the input signal, the signal to be amplified will also affect the output power level of the amplified signal independent of supply power. Thus, in systems in which it is desirable to maintain a power amplifier at or near its saturation level, it becomes necessary to modify or modulate the power level of the amplifier's supply voltage.

One example of an apparatus that utilizes variable supply voltage in an RF transmitter is an envelope elimination and restoration (EER) amplifier. An EER amplifier generates a signal component representative of an input signal's envelope and couples the signal to the supply input of a power amplifier. The EER amplifier will also generate a signal component representative of the input signal's phase and couples that signal to the input of the power amplifier. As a result, the component of the input signal representative of the signal's phase will have its amplitude adjusted corresponding to the value of the component of the input signal representative of the signal's envelope, which is coupled to the power supply input of the power amplifier.

Transmitters that use EER amplifiers are known to exhibit significant intermodulation distortion levels due to the finite bandwidth in the envelope path. This distortion reduces the overall capability of the EER technique and limits its usefulness to narrowband signals. As a result, EER-based transmitters have seen only limited use.

SUMMARY OF THE INVENTION

In view of the above noted shortcomings of known EER transmitters, at least one embodiment of the invention provides an envelope elimination and restoration (EER) radio frequency (RF) transmitter. The EER transmitter according to this embodiment comprises a data source input adapted to receive a data signal to be transmitted, an envelope signal path comprising a power supply modulator, a phase signal path comprising a local oscillator, a power amplifier at the terminal end of the envelope and phase signal paths that recombines the two signals for RF transmission, and a pre-emphasis filter in the envelope signal path adapted to pre-emphasize the envelope signal before it reaches the power supply modulator.

Another embodiment according to this invention provides a system for power amplification of an input signal prior to RF transmission of the input signal. The system for power amplification of an input signal prior to RF transmission according to this embodiment comprises an envelope detector circuit adapted to generate an envelope voltage level from the input signal, a power supply modulator coupled to the envelope detector circuit adapted to determine a supply voltage from the envelope voltage level signal, an input signal conditioning circuit adapted to remove amplitude information from the input signal and to mix the stripped signal with a local oscillator signal, a power amplifier that receives as inputs signals from the power supply modulator and the input signal conditioning circuit and whose output is connected to an RF antenna, and a pre-emphasis module adapted to perform a pre-emphasis operation on the envelope voltage level signal prior to input to the power supply modulator.

In an additional embodiment of the invention, a method for extending the bandwidth capabilities of an envelope elimination and restoration (EER) RF transmitter is provided. The method according to this embodiment comprises applying a pre-emphasis filter to an envelope signal prior to that signal being input to a supply modulator that is coupled to a power amplifier of the RF transmitter.

A further embodiment of the invention provides a method of generating a supply modulator signal for a power amplifier of an RF transmitter. The method according to this embodiment comprises separating a digital data source signal into respective envelope and phase data paths, subjecting the digital data source signal on the envelope data path to an envelope detection process that generates a signal corresponding to the envelope of the digital data, applying a pre-emphasis filter to this envelope signal to generate a pre-emphasized envelope signal, performing a digital to analog conversion of the pre-emphasized envelope signal, and supplying the pre-emphasized envelope signal to a power supply modulator connected to the input of the power amplifier.

These and other embodiments and advantages of the present invention will become apparent from the following detailed description, taken in conjunction with the accompanying drawings, illustrating by way of example the principles of the invention.

Figure 6A:
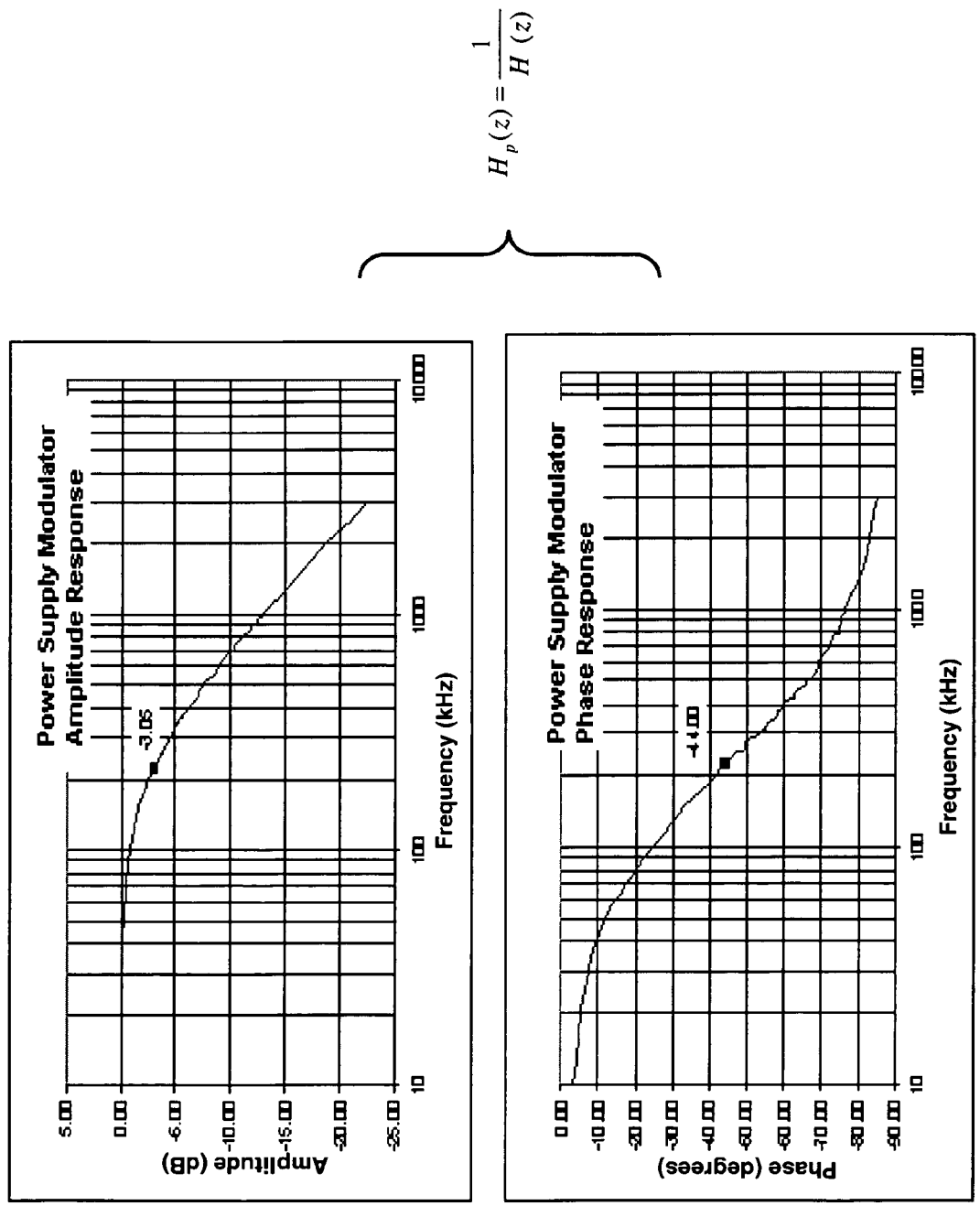
Figure 6B:
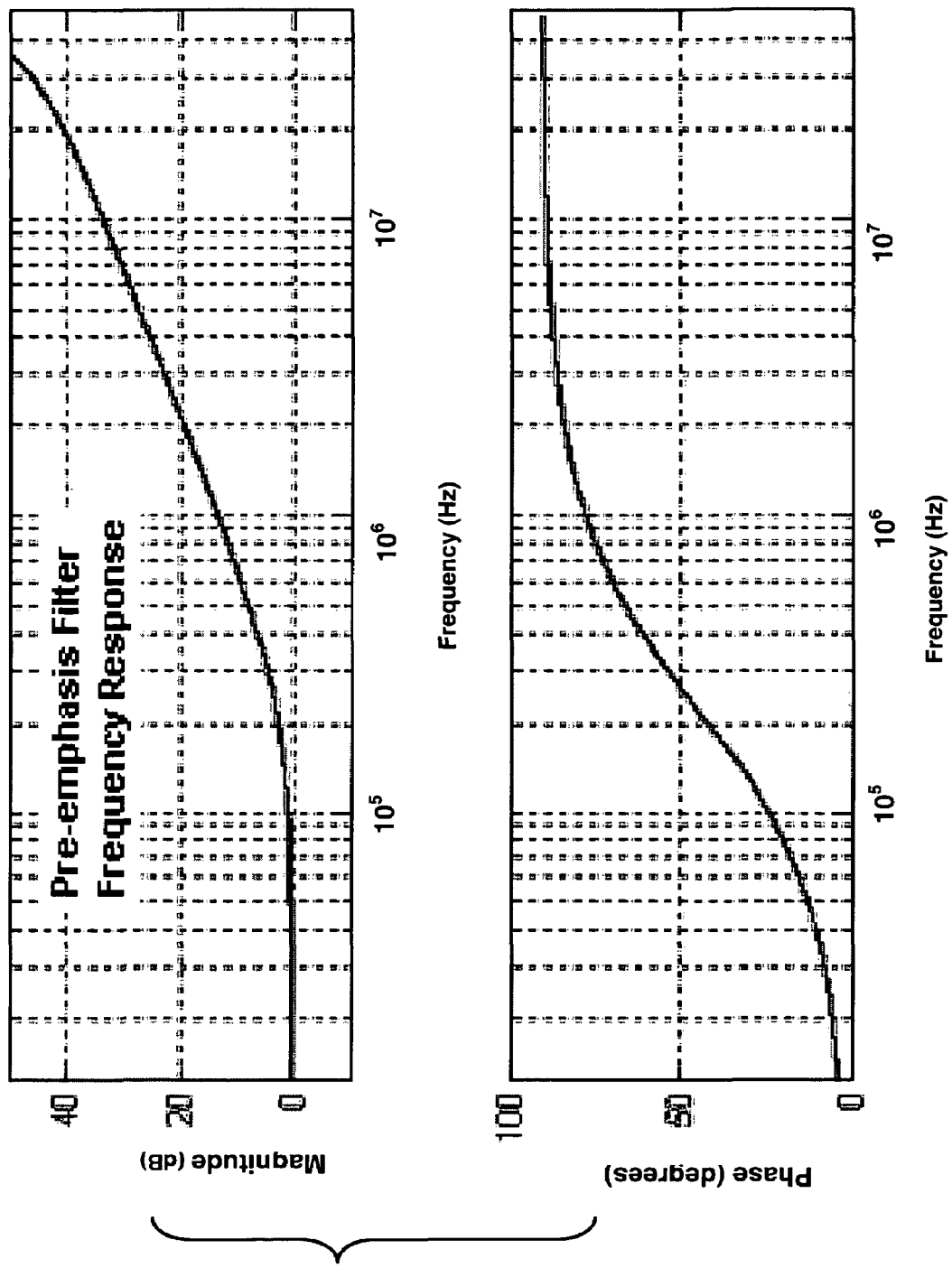
Figure 6C:
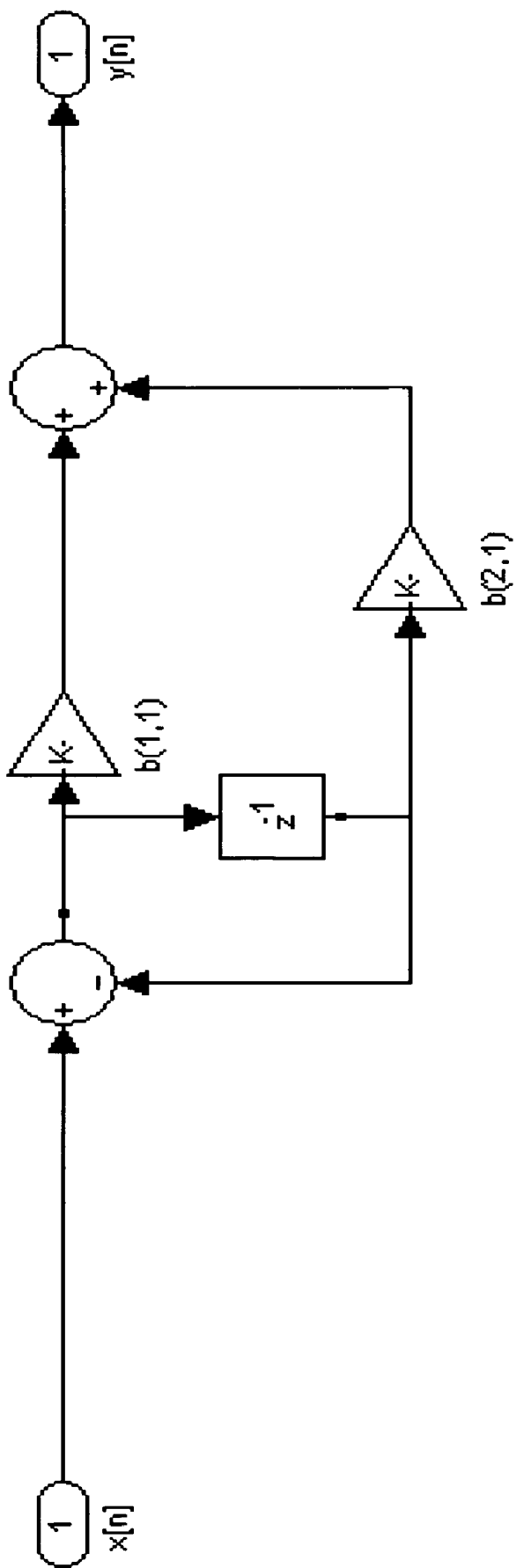
Figure 7A:
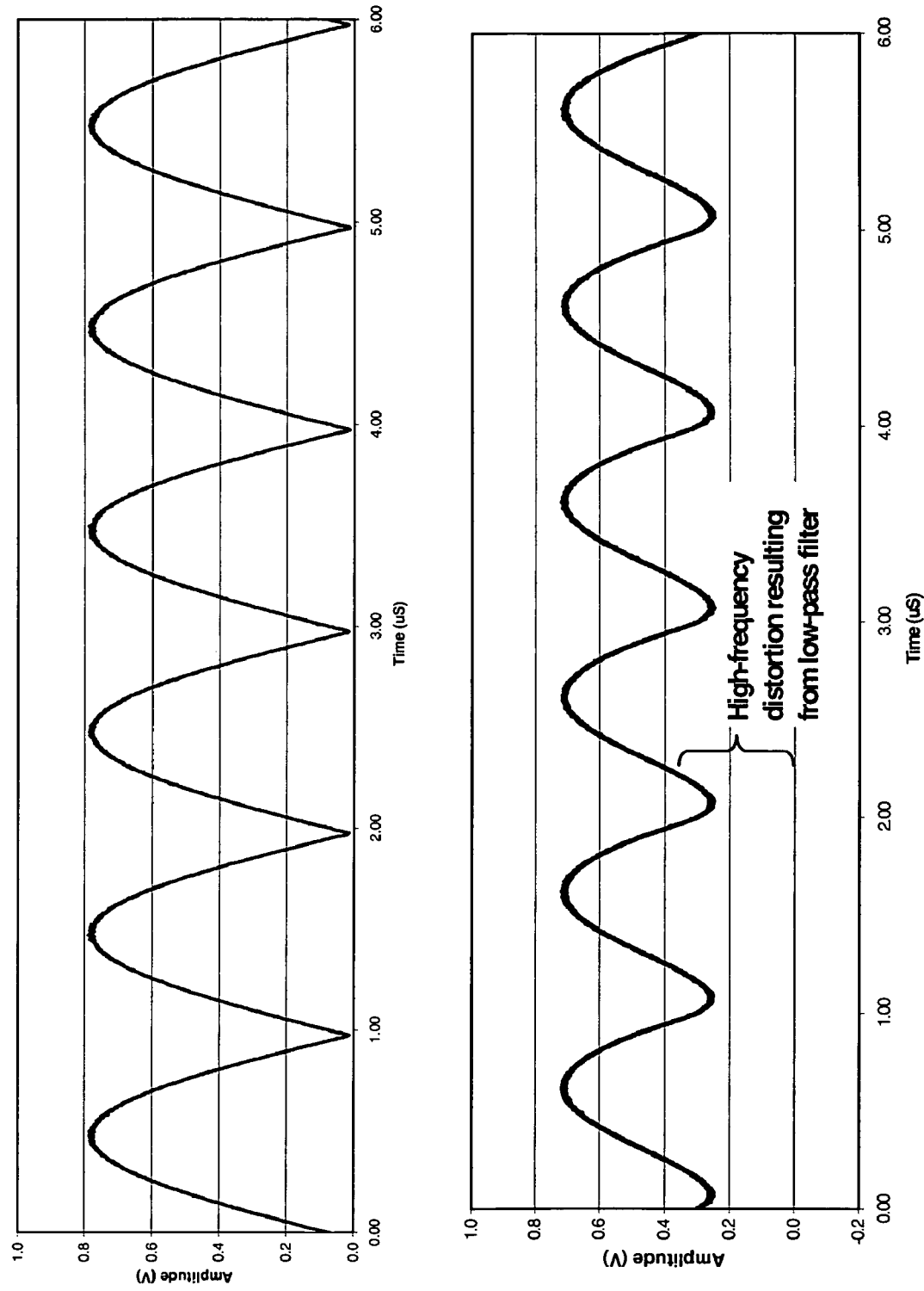
Figure 7B:
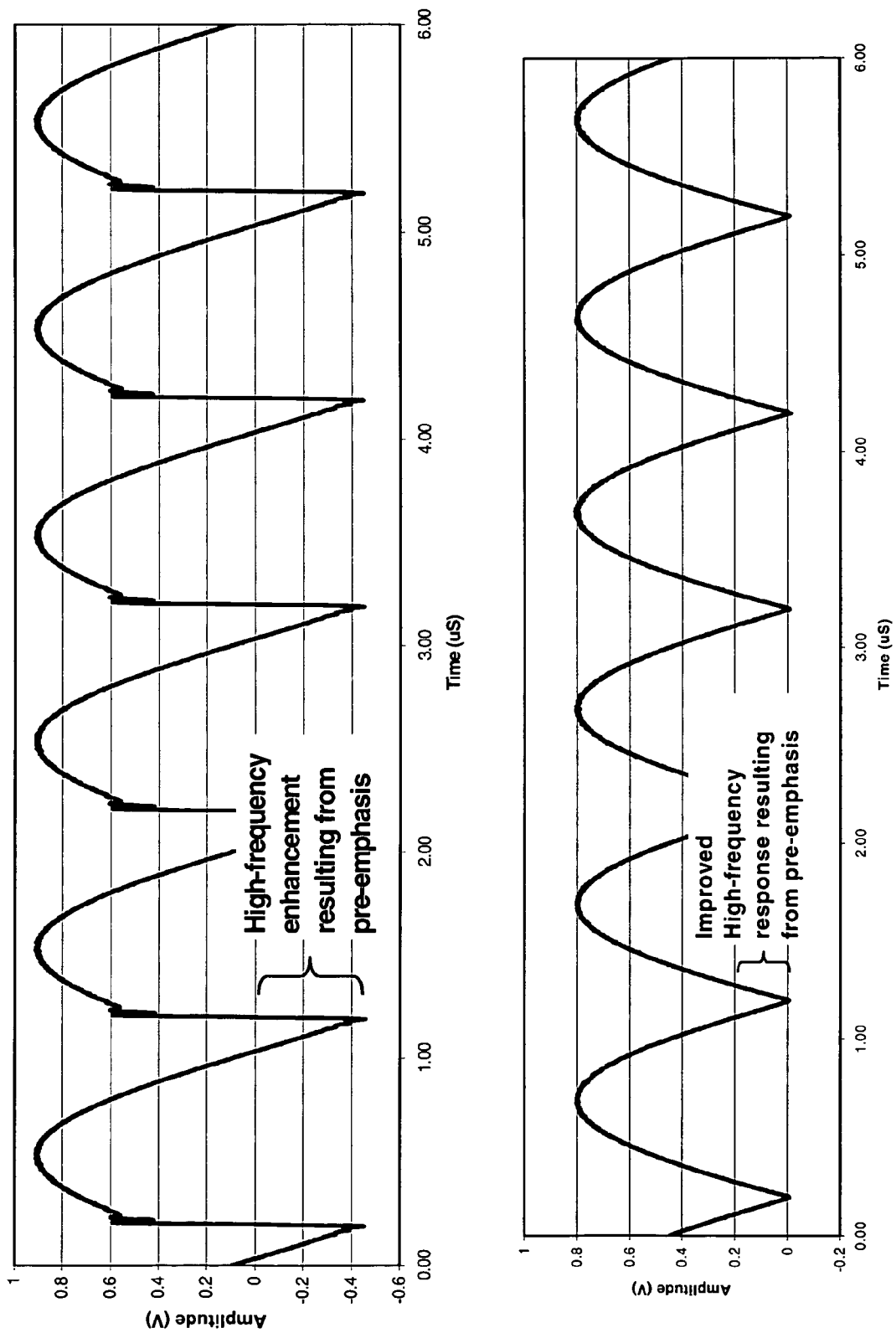

transmitter having an increased bandwidth capability and reduced intermodulation distortion according to at least one embodiment of the invention;

FIG. 6 is a Bode plot illustrating the amplitude and phase frequency response of a power supply modulator and the corresponding inverse amplitude and phase frequency response of the pre-emphasis filter according to at least one embodiment of the invention;

FIG. 7 is a series of graphs illustrating measured results of a data source signal in an EER transmitter using a pre-emphasis filter according to one or more embodiments of the invention including the signal before the supply modulator, the signal after the supply modulator without pre-emphasis applied, the signal before the supply modulator with pre-emphasis applied and the signal after the supply modulator with pre-emphasis applied.

Figure 8:
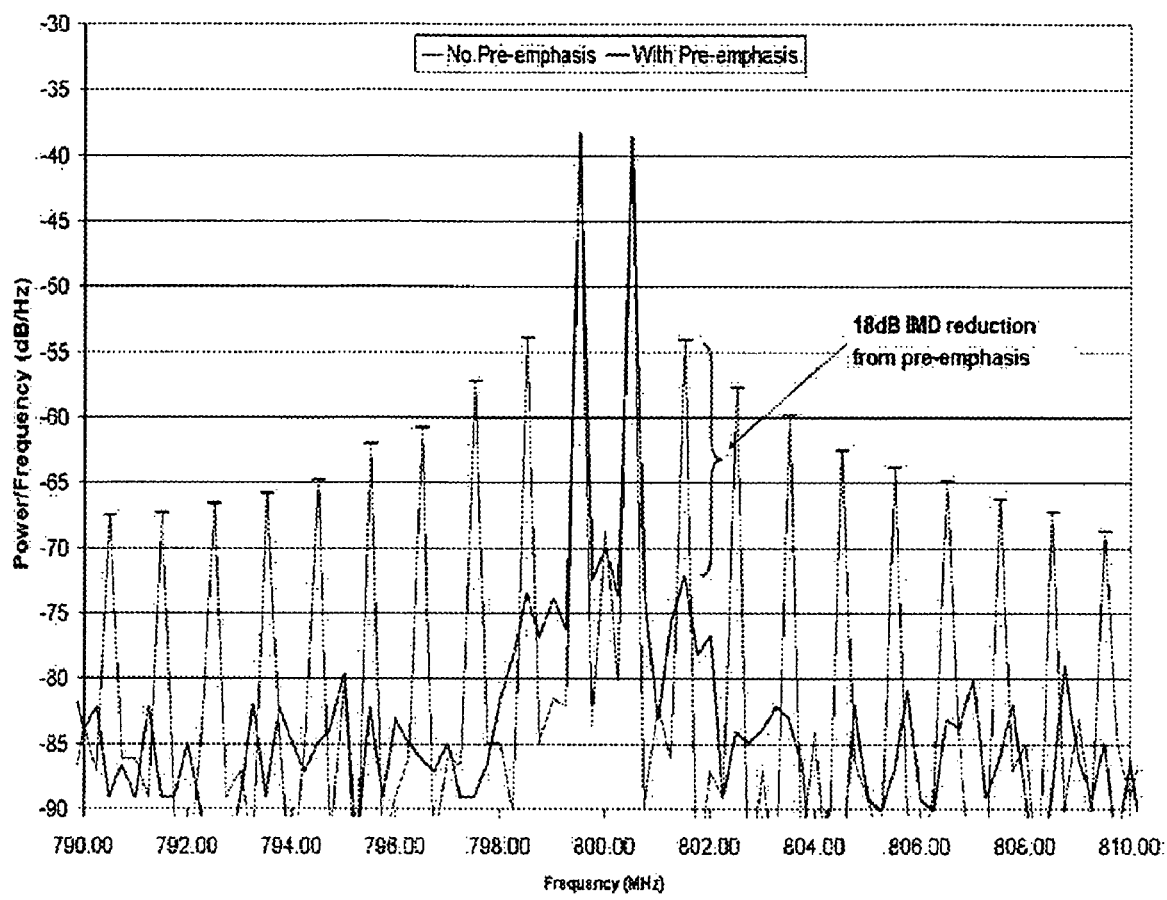
Figure 9:
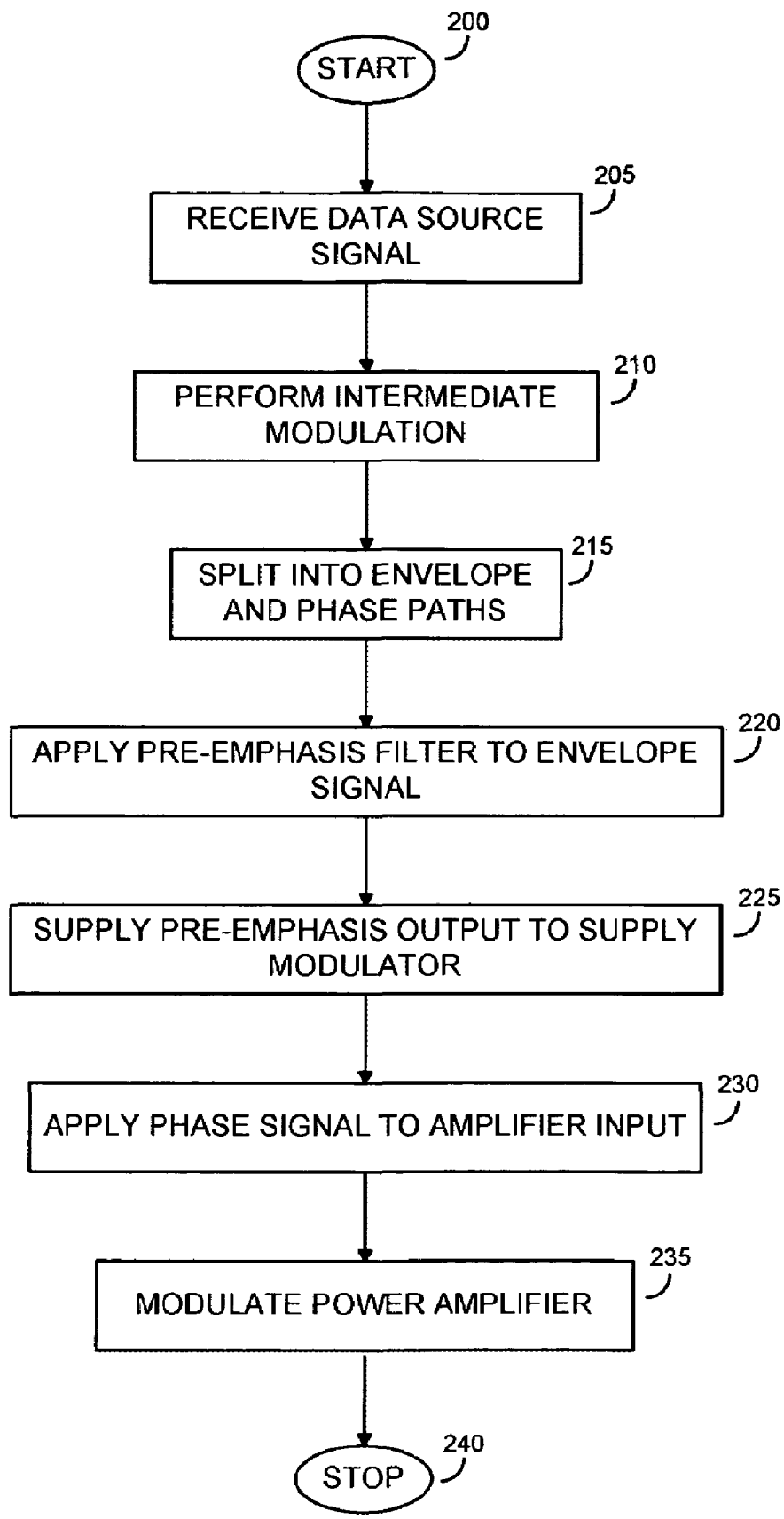

FIG. 8 is a frequency domain plot of a simulation result of an EER transmitter using a DSB-SC AM signal with 500 kHz modulation bandwidth at 800 MHz RF with an 850 kHz envelope bandwidth both with and without pre-emphasis filtering applied in accordance with the various embodiments of the invention; and FIG. 9 is a flow chart outlining the steps of a method for enhancing bandwidth in an EER transmitter according to various embodiments of the invention.

DETAILED DESCRIPTION

The following description is intended to convey a thorough understanding of the embodiments described by providing a number of specific embodiments and details involving pre-emphasis of envelope signals in envelope elimination and restoration transmitters for the purpose of extending the bandwidth capability of the transmitter. It should be appreciated, however, that the present invention is not limited to the specific embodiments and details described herein, which are exemplary only. It is further understood that one possessing ordinary skill in the art, in light of known systems and methods, would appreciate the use of the invention for its intended purposes and benefits in any number of alternative embodiments, depending upon specific design and other needs.

Figure 1:
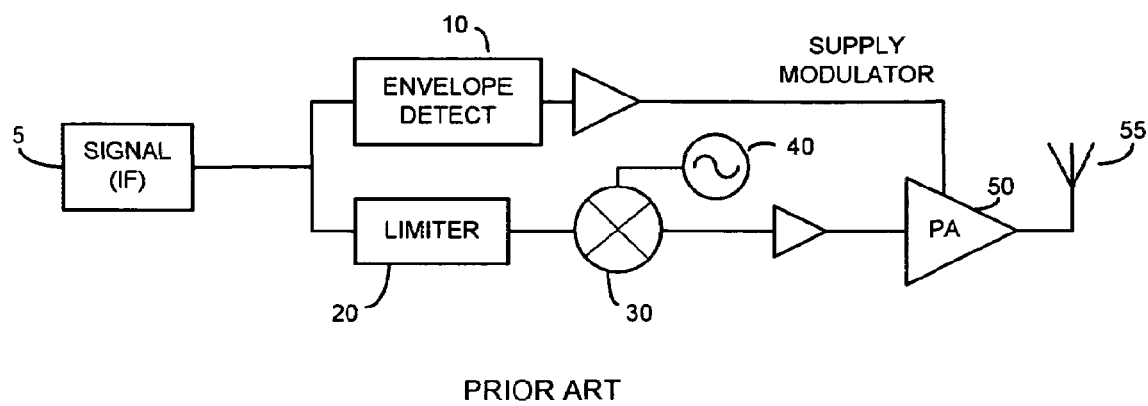
FIG. 1 is a block circuit diagram illustrating an exemplary topology of a conventional envelope elimination and restoration (EER) transmitter.

Referring now to FIG. 1, a block circuit diagram illustrating an exemplary topology of a conventional envelope elimination and restoration (EER) transmitter is depicted. The transmitter includes a signal source 5 for receiving a signal to be amplified and transmitted. An envelope detector 10 receives the signal to be amplified and produces an envelope signal corresponding to the envelope of that signal. The envelope signal is fed to a power supply modulator connected to the power source input of a power amplifier 50 of the transmitter. The signal to be amplified is also received by a limiter 20. The signal produced by the limiter 20 contains the phase component of the signal to be amplified. This signal is supplied to the input of the power amplifier 50 and is amplified in accordance with the amplification level dictated by the power supply modulator. The power amplifier 50 is coupled to an RF antenna 55.

As noted above, conventional EER transmitters exhibit significant intermodulation distortion levels due to finite bandwidth in the envelope signal path. As a result, the performance of the EER transmitter is reduced, thereby limiting its application to relatively low bandwidth signals, typically less than 100 kHz.

Figure 2:
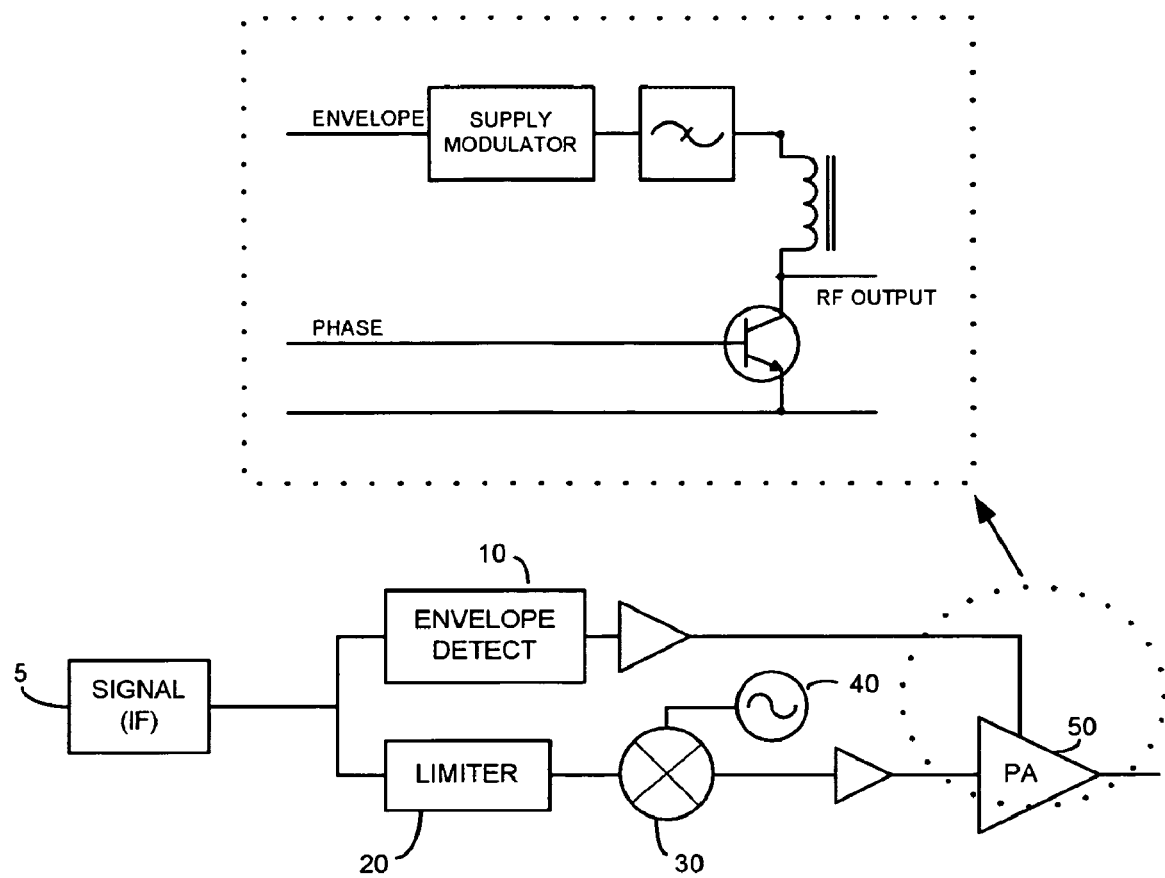
FIG. 2 is a block circuit diagram illustrating an exemplary topology of the conventional EER transmitter of FIG. 1 highlighting the supply modulator components that are primarily responsible for intermodulation distortion.

FIG. 2 is a block circuit diagram illustrating an exemplary topology of the conventional EER transmitter of FIG. 1 highlighting the supply modulator components that create the intermodulation distortion. The contents of the dotted circle surrounding the power amplifier 50 and corresponding signal and power inputs is shown in greater detail in the box above. The supply modulator is used to reapply the input signal's envelope information to the amplified phase information by supplying a modulated power source to the signal corresponding to the input signal's envelope. The supply modulator includes low-pass filters for suppression of higher frequency harmonics. Loss of the high frequency content of the original signal produces intermodulation distortion when the phase and envelope signal are recombined in the amplifier.

Figure 3:
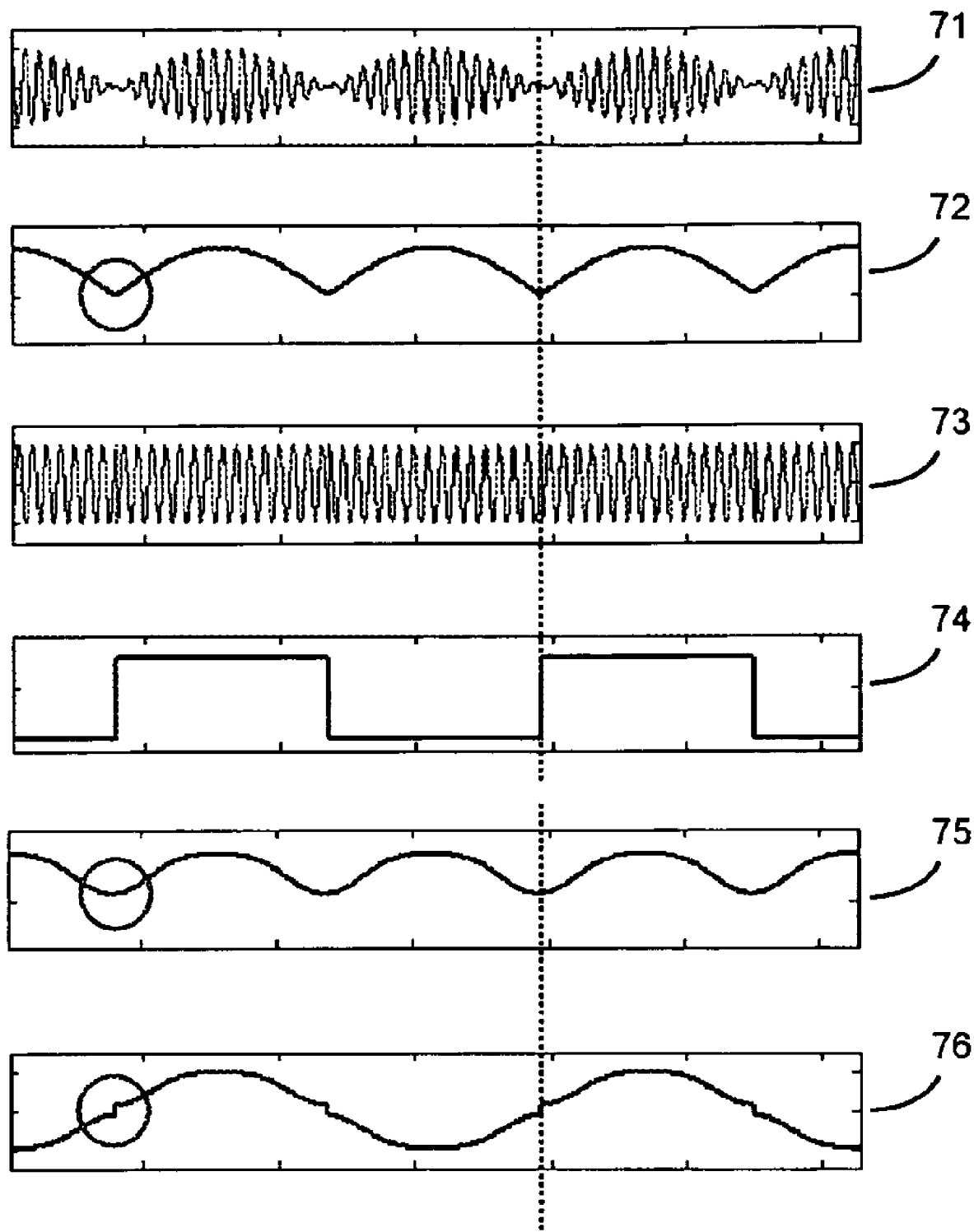
FIG. 3 is a series of graphs depicting simulation results of a double sideband-suppressed carrier amplitude modulated (DSB-SC AM) signal in a conventional EER transmitter illustrating the results of intermodulation distortion on the resultant waveform.

FIG. 3 is a series of graphs depicting simulation results of a double sideband-suppressed carrier amplitude modulated (DSB-SC AM) signal in a conventional EER transmitter illustrating the results of intermodulation distortion on the resultant waveform. The first graph 71 shows the source input, in this case, a DSB-SC waveform. The DSB-SC waveform can be defined as $v_i(t)=E_i(\theta)\cos[\omega_c t+\phi_i(\theta)]$. The envelope signal of the DSB-SC signal 71 is shown in graph 72. The envelope signal is given by the expression $E_i(\theta)=|\cos(\theta)|$. The phase signal component of the DSB-SC is shown in graph 73 and is derived from the expression $$\phi_o(\theta) = \frac{\pi}{2}[1 - c(\theta)].$$

The phase signal undergoes phase reversal as shown in graph 74 and given by the following expression:

$$c(\theta) = \begin{cases} +1 & 0 \le \theta \le \frac{\pi}{2}, \quad \frac{3\pi}{2} \le \theta \le 2\pi \\ -1 & \frac{\pi}{2} \le \theta \le \frac{3\pi}{4} \end{cases}$$

When the envelope signal is low pass filtered as shown in FIG. 2, the high frequency content is reduced and the signal becomes distorted. As shown in graph 75, this occurs at the time when the phase changes occur. Thus, when the filtered envelope signal is recombined with the phase signal at the power amplifier, intermodulation distortion occurs when the input signal transitions abruptly at the phase switch point, as illustrated in graph 76.

Figure 4:
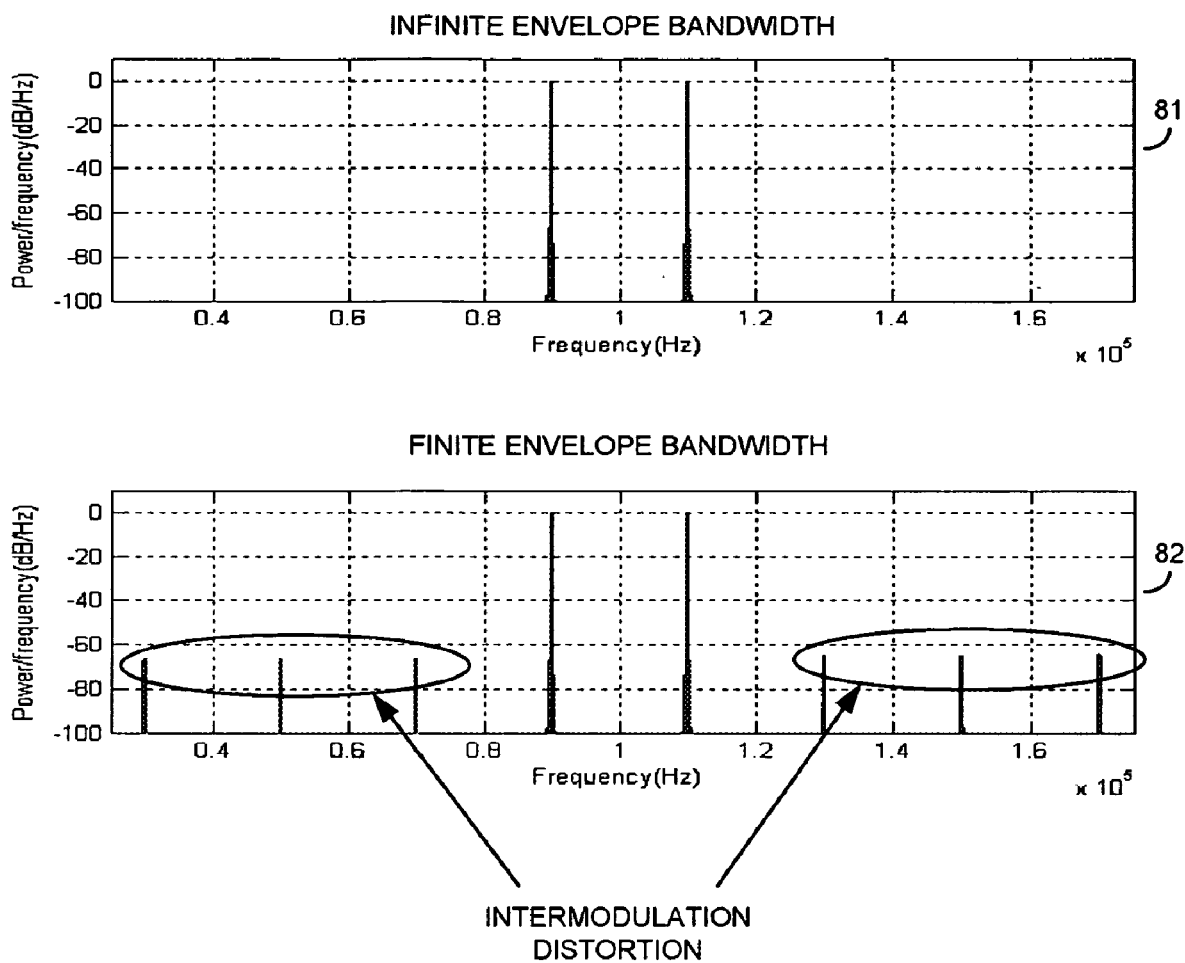
FIG. 4 is a frequency domain plot of simulation results using a 10 kHz DSB-SC AM signal with a 20 kHz envelope using infinite envelope bandwidth and finite envelope bandwidth resulting in intermodulation distortion.

FIG. 4 is a frequency domain plot of simulation results using a 10 kHz DSB-SC AM signal with a 20 kHz envelope using infinite envelope bandwidth and finite envelope bandwidth resulting in intermodulation distortion. As evident in the graphs of FIG. 4, when infinite bandwidth is available in the envelope path, the resultant signal is devoid of intermodulation distortion. However, in the case of a conventional EER transmitter, the finite envelope path bandwidth results in intermodulation distortion. The intermodulation distortion shows up as harmonic echoes around the desired signal, as shown on the right and left sides of 100 kHz frequency.

Figure 5:
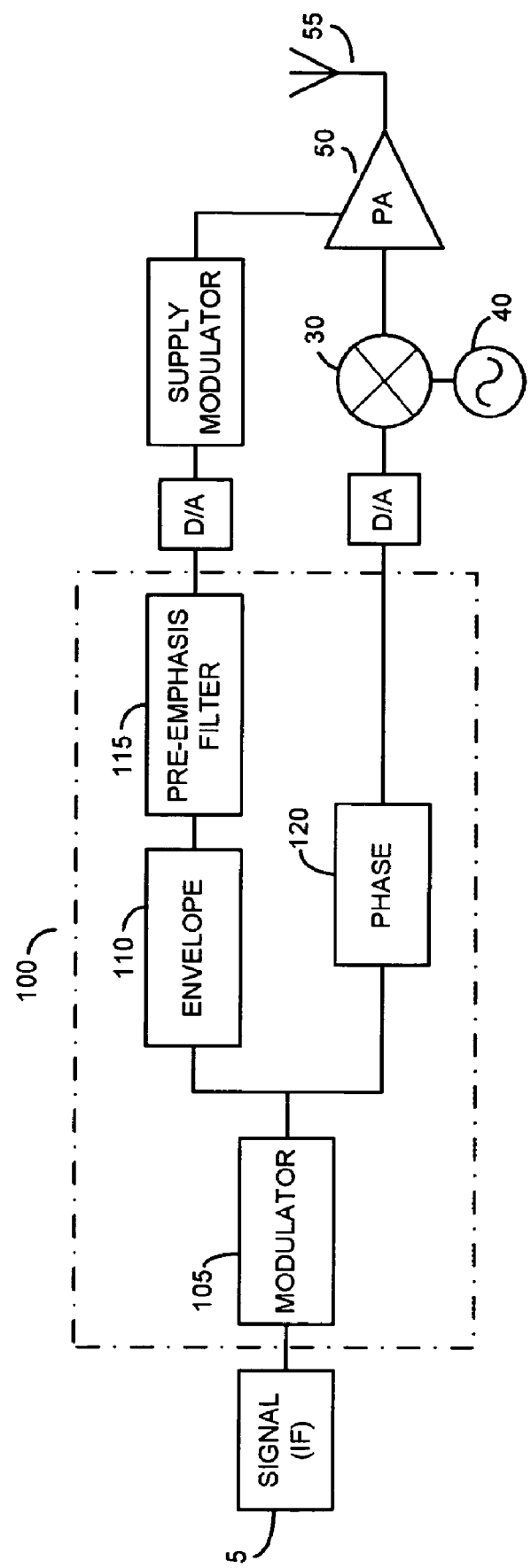
FIG. 5 is a block circuit diagram illustrating an exemplary topology of an envelope elimination and restoration (EER)

Referring now to FIG. 5, a block circuit diagram illustrating an exemplary topology of an envelope elimination and restoration (EER) transmitter having an increased bandwidth and reduced intermodulation distortion according to at least one embodiment of the invention is depicted. The EER transmitter begins with a signal source 5 and terminates with a power amplifier 50 connected to a RF antenna 55. The power amplifier 50 is modulated by a supply modulator in accordance with an envelope signal of the input waveform. Also, the phase component is fed to the power amplifier's 50 signal input. However, the transmitter of FIG. 5 differs from the conventional transmitter in that logic block 100 includes a pre-emphasis filter 115 prior to the supply modulator that, in various embodiments, pre-emphasizes the envelope signal with the inverse frequency response of the supply modulator.

In various embodiments, the block 100 may be implemented as a single circuit board, as a plurality of discrete circuit elements, or in programmable logic such as a field programmable gate array (FPGA). One or more of the block components 100 may also be implemented as code executed by a digital signal processor (DSP).

Referring now to FIG. 6, a Bode plot illustrating the amplitude and phase frequency response of a power supply modulator and the corresponding inverse amplitude and phase frequency response of the pre-emphasis filter according to at least one embodiment of the invention is depicted. As shown in the graphs on the left of the Figure, the power supply modulator has a generally low pass frequency response, with a cut off frequency around 100 kHz. Conversely, the pre-emphasis filter has a frequency response that is generally high pass, passing frequencies above 100 kHz. This pre-emphasis filter can be realized as shown in the figure as an infinite impulse response (IIR) digital filter.

FIG. 7 is a series of graphs illustrating measured results of a data source signal in an EER transmitter using a pre-emphasis filter according to one or more embodiments of the invention including the signal before the supply modulator, the signal after the supply modulator without pre-emphasis applied, the signal before the supply modulator with pre-emphasis applied and the signal after the supply modulator with pre-emphasis applied. The first graph in FIG. 7 shows the envelope signal before reaching the supply modulator. The second graph shows the same envelope signal after modulation by the supply modulator. As seen in this graph, the supply modulator has resulted in high-frequency distortion resulting from the low-pass filter response. The high-frequency transitions have been clipped.

The third graph of FIG. 7 shows the same envelope signal as the first graph, but with pre-emphasis filtering applied in accordance with at least one embodiment of the invention. As shown in the Figure, the high-frequency enhancement resulting from the pre-emphasis pre-biases the signal to prevent the affects of the supply modulator. The resulting post supply modulator signal shown in the fourth graph of FIG. 7 shows a graph nearly identical to that of the first graph, that is, the original envelope signal prior to modulation. This resulting graph is devoid of the high-frequency distortion typically resulting from supply modulators in EER transmitters.

FIG. 8 is a frequency domain plot of measured results of result of an EER transmitter on a DSB-SC AM signal with 500 kHz modulation bandwidth at 800 MHz RF with an 850 kHz envelope bandwidth both with and without pre-emphasis filtering applied in accordance with the various embodiments of the invention. The comparison graph of FIG. 8 shows approximately 18 dB reduction in intermodulation distortion when compared to the same system without pre-emphasis filtering. The measured results in the graph of FIG. 8 show intermodulation distortion levels with and without pre-emphasis applied. The darker line, representing the signal with pre-emphasis applied, shows a significant reduction in distortion across the entire range of frequencies. The inventor of this invention also discovered that the applying the pre-emphasis filter also made the system robust to mismatch errors. A ten percent (10%) mismatch between the pre-emphasis filter and the system response resulted in only 3 dB degradation in intermodulation reduction—that is, intermodulation reduction was still significant even in the presence of a 10% mismatch. Similar testing was done with the same system as that shown in FIG. 8, but with a DSB-SC AM signal with 50 kHz modulation bandwidth at 40 MHz RF with a 225 kHz envelope and a 850 kHz envelope bandwidth resulting in 11 dB and 16 dB intermodulation distortion respectively.

FIG. 9 is a flow chart outlining the steps of a method for enhancing bandwidth in an EER transmitter according to various embodiments of the invention. The process beings in block 200. In block 205, a data source signal is received in the transmitter. The data source signal is any signal to be output by the EER transmitter. Next, in block 210, intermediate modulation (IM) is performed. This can be performed using any known modulation technique. Then, in block 215, the signal is split into envelope and phase paths. After the transmit signal has been split, in block 220, pre-emphasis is applied to the envelope signal. As discussed herein, in various embodiments, this may comprise applying a pre-emphasis filter that has been designed/programmed to apply an inverse supply modulator frequency response to the transmit signal to pre-bias the signal to counter the modulator's unintended effects. Next, in block 225, the output of the pre-emphasis is supplied to the supply modulator. In block 230, the phase signal is applied to the amplifier's input. In block 235, the supply modulator modulates the power supply (power amplifier) so that the phase signal is amplified according to the envelope signal's amplitude for transmission. The method stops in block 240.

Thus, as seen from the simulation results, the pre-emphasis techniques described herein in accordance with the various embodiments of the invention reduce intermodulation distortion in an envelope elimination and restoration transmitter, and thereby increasing the effective bandwidth of these devices. The pre-emphasis techniques disclosed herein may be implemented at the circuit level in a variety of different manifestations including, as part of an intermodulation algorithm, just prior to reaching the power supply modulator in programmable logic (PLA, FPGA, etc.) or even in analog circuitry with little impact on existing EER transmitter designs and minimal additional power consumption.

The embodiments of the present inventions are not to be limited in scope by the specific embodiments described herein. For example, although many of the embodiments disclosed herein have been described in the context of a envelope elimination and restoration transmitter having a intermediate modulation block, other embodiments, in addition to those described herein, will be apparent to those of ordinary skill in the art from the foregoing description and accompanying drawings. Thus, such modifications are intended to fall within the scope of the following appended claims. Further, although some of the embodiments of the present invention have been described herein in the context of a particular implementation in a particular environment for a particular purpose, those of ordinary skill in the art will recognize that its usefulness is not limited thereto and that the embodiments of the present inventions can be beneficially implemented in any number of environments for any number of purposes. Many modifications to the embodiments described above can be made without departing from the spirit and scope of the invention. Accordingly, the claims set forth below should be construed in view of the full breath and spirit of the embodiments of the present inventions as disclosed herein. Also, while the foregoing description includes many details and specificities, it is to be understood that these have been included for purposes of explanation only, and are not to be interpreted as limitations of the present invention.

The invention claimed is:

1. An envelope elimination and restoration (EER) radio frequency (RF) transmitter comprising:

a data source input adapted to receive a data signal to be transmitted;

an envelope signal path comprising a power supply modulator;

a phase signal path comprising a local oscillator;

a power amplifier at the terminal end of the envelope and phase signal paths that recombines the two signals for RF transmission; and a pre-emphasis filter in the envelope signal path adapted to pre-emphasize the envelope signal before it reaches the power supply modulator.

2. The transmitter according to claim 1, wherein the pre-emphasis filter is a digital pre-emphasis filter.

3. The transmitter according to claim 1, wherein the pre-emphasis filter increases the bandwidth of the transmitter by reducing an intermodulation distortion level cause by the power supply modulator.

4. The transmitter according to claim 3, wherein the pre-emphasis filter approximates an inverse frequency response of the power supply modulator.

5. The transmitter according to claim 1, wherein the pre-emphasis filter is a digital infinite impulse response filter implemented in a programmable circuit logic.

6. The transmitter according to claim 1, wherein the pre-emphasis filter is a digital infinite impulse response filter implemented in a digital signal processor routine.

7. A system for power amplification of an input signal prior to RF transmission of the input signal comprising:

an envelope detector circuit adapted to generate an envelope voltage level from the input signal;

a power supply modulator coupled to the envelope detector circuit adapted to determine a supply voltage from the envelope voltage level signal;

an input signal conditioning circuit adapted to remove amplitude information from the input signal and to mix the stripped signal with a local oscillator signal;

a power amplifier that receives as inputs signals from the power supply modulator and the input signal conditioning circuit and whose output is connected to an RF antenna; and a pre-emphasis module adapted to perform a pre-emphasis operation on the envelope voltage level signal prior to input to the power supply modulator.

8. The system according to claim 7, wherein the pre-emphasis module is implemented in digital electronics.

9. The system according to claim 7, wherein the pre-emphasis module is implemented as programmable circuit logic.

10. The system according to claim 7, wherein the pre-emphasis module is implemented as a routine executed by a digital signal processor.

11. The system according to claim 7, wherein the pre-emphasis filter increases the bandwidth of the transmitter by reducing an intermodulation distortion level caused by the power supply modulator.

12. The transmitter according to claim 11, wherein the pre-emphasis filter approximates an inverse frequency response of the power supply modulator.

13. A method of extending the bandwidth capabilities of an envelope elimination and restoration RF transmitter comprising:

applying a pre-emphasis filter to an envelope signal prior to that signal being input to a supply modulator that is coupled to a power amplifier of the RF transmitter.

14. The method according to claim 13, wherein applying a pre-emphasis filter comprises determining a frequency response of the power supply modulator and applying a filter that approximates an inverse of the modulator's frequency response.

15. The method according to claim 13, wherein applying a pre-emphasis filter comprises applying a digital pre-emphasis filter implemented in digital circuitry of the RF transmitter.

16. The method according to claim 13, wherein applying a pre-emphasis filter comprises applying a digital pre-emphasis filter implemented in a programmable logic circuit.

17. The method according to claim 13, wherein applying a pre-emphasis filter comprises subjecting the envelope signal to a routine executed on a digital signal processor.

18. A method of generating a supply modulator signal for a power amplifier of an RF transmitter comprising:

separating a digital data source signal into respective envelope and phase data paths;

subjecting the digital data source signal on the envelope data path to an envelope detection process that generates a signal corresponding an envelope of the digital data source signal;

applying a pre-emphasis filter to this envelope signal to generate a pre-emphasized envelope signal;

performing a digital to analog conversion of the pre-emphasized envelope signal; and supplying the pre-emphasized envelope signal to a power supply modulator connected to the input of the power amplifier.

19. The method according to claim 18, wherein applying a pre-emphasis filter comprises determining a frequency response of the power supply modulator and applying a filter that approximates an inverse of the modulator's frequency response.

20. The method according to claim 18, wherein applying a pre-emphasis filter comprises applying a digital pre-emphasis filter implemented in a programmable logic circuit.

21. The method according to claim 18, wherein applying a pre-emphasis filter comprises subjecting the envelope signal to a routine executed on a digital signal processor.

* * * * *